United States Patent
Ito

(10) Patent No.: US 10,033,480 B2
(45) Date of Patent: Jul. 24, 2018

(54) WIRELESS COMMUNICATION DEVICE AND METHOD

(71) Applicant: HITACHI KOKUSAI ELECTRIC INC., Tokyo (JP)

(72) Inventor: Kei Ito, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/434,237

(22) Filed: Feb. 16, 2017

(65) Prior Publication Data

US 2017/0163379 A1 Jun. 8, 2017

Related U.S. Application Data

(63) Continuation-in-part of application No. PCT/JP2015/074958, filed on Sep. 2, 2015.

(30) Foreign Application Priority Data

Sep. 12, 2014 (JP) ................................. 2014-186030

(51) Int. Cl.
*H03M 13/00* (2006.01)
*H04L 1/00* (2006.01)
(Continued)

(52) U.S. Cl.
CPC .......... *H04L 1/0041* (2013.01); *H04L 1/0071* (2013.01); *H04L 25/03891* (2013.01);
(Continued)

(58) Field of Classification Search
CPC ................. H04L 1/0041; H04L 1/0071; H04L 25/03891; H04L 27/34; H04L 27/18; H03M 13/2792; H03M 13/4138; H03M 13/6508
See application file for complete search history.

(56) References Cited

U.S. PATENT DOCUMENTS

| | | | |
|---|---|---|---|
| 2002/0150038 A1 | 10/2002 | Sumasu et al. | |
| 2007/0058745 A1* | 3/2007 | Watanabe | H04L 25/03171 375/264 |
| 2013/0044841 A1 | 2/2013 | Mori et al. | |

FOREIGN PATENT DOCUMENTS

| | | |
|---|---|---|
| JP | 2004-364046 A | 12/2004 |
| JP | 2013-042444 A | 2/2013 |
| WO | 02/05467 A1 | 1/2002 |

OTHER PUBLICATIONS

International Search Report dated Oct. 13, 2015.

* cited by examiner

*Primary Examiner* — Sam Rizk
(74) *Attorney, Agent, or Firm* — Bacon & Thomas, PLLC

(57) ABSTRACT

SISO decoding of a reception signal having a scrambled symbol arrangement is realized using a process having reduced complexity. Coordinates are generated for a reference point obtained by scrambling and mapping a symbol number not a symbol reference point position. This reference point simulates transmission-side scrambling and is generated for each symbol number by a first mapping unit. Because the binary expression of a corresponding original signal number is retained, a bit likelihood calculation unit can easily calculate a bit likelihood based on the distance between the reference point and a reception signal. The calculated bit likelihood is then deinterleaved and subjected to SISO error-correcting decoding. The thus obtained bit likelihood is then reinterleaved and used to calculate a symbol probability. Soft symbols are generated through the multiplication of all the calculated symbol probabilities by corresponding reference points output by a second mapping unit similar to the first mapping unit.

2 Claims, 10 Drawing Sheets

(51) Int. Cl.
*H04L 25/03* (2006.01)
*H04L 27/34* (2006.01)
*H04L 27/18* (2006.01)
H03M 13/27 (2006.01)
H03M 13/41 (2006.01)

(52) U.S. Cl.
CPC .............. *H04L 27/18* (2013.01); *H04L 27/34* (2013.01); *H03M 13/2792* (2013.01); *H03M 13/4138* (2013.01); *H03M 13/6508* (2013.01)

FIG.4

| QPSK | | 8PSK | | 16QAM | | 32QAM | | 64QAM | |
|---|---|---|---|---|---|---|---|---|---|
| INPUT | SYMBOL NUMBER | INPUT | SYMBOL NUMBER | INPUT | SYMBOL NUMBER | INPUT | SYMBOL NUMBER | INPUT | SYMBOL NUMBER |
| 00 | 0 | 000 | 1 | $b_0 b_1 b_2 b_3$ | $(b_0 b_1 b_2 b_3)_2$ | $b_0 b_1 b_2 b_3 b_4$ | $(b_0 b_1 b_2 b_3 b_4)_2$ | $b_0 b_1 b_2 b_3 b_4 b_5$ | $(b_0 b_1 b_2 b_3 b_4 b_5)_2$ |
| 01 | 2 | 001 | 0 | | | | | | |
| 10 | 6 | 010 | 2 | | | | | | |
| 11 | 4 | 011 | 3 | | | | | | |
| | | 100 | 6 | | | | | | |
| | | 101 | 7 | | | | | | |
| | | 110 | 5 | | | | | | |
| | | 111 | 4 | | | | | | |

RECEPTION SIGNAL AND REFERENCE POINT NUMBERS BEFORE SCRAMBLING

RECEPTION SIGNAL AND REFERENCE POINT NUMBERS AFTER SCRAMBLING

FIG.8

| SYMBOL MAPPING NUMBER (NUMBER AFTER SCRAMBLING) | $b_0$ | $b_1$ | $b_2$ | $b_3$ | DISTANCE FROM RECEPTION POINT |
|---|---|---|---|---|---|
| 0 (5) | 0 | 0 | 0 | 0 | 3.1588 |
| 1 (4) | 0 | 0 | 0 | 1 | 2.2804 |
| 2 (7) | 0 | 0 | 1 | 0 | 3.7000 |
| 3 (6) | 0 | 0 | 1 | 1 | 1.3446 |
| 4 (1) | 0 | 1 | 0 | 0 | 0.4804 |
| 5 (0) | 0 | 1 | 0 | 1 | 1.3000 |
| 6 (3) | 0 | 1 | 1 | 0 | 0.0412 |
| 7 (2) | 0 | 1 | 1 | 1 | 0.4128 |
| 8 (13) | 1 | 0 | 0 | 0 | 3.3196 |
| 9 (12) | 1 | 0 | 0 | 1 | 2.5000 |
| 10 (15) | 1 | 0 | 1 | 0 | 3.7588 |
| 11 (14) | 1 | 0 | 1 | 1 | 1.6551 |
| 12 (9) | 1 | 1 | 0 | 0 | 0.6412 |
| 13 (8) | 1 | 1 | 0 | 1 | 1.5196 |
| 14 (10) | 1 | 1 | 1 | 0 | 0.1000 |
| 15 (11) | 1 | 1 | 1 | 1 | 0.7234 |

FIG.9

|  | $b_0$ | $b_1$ | $b_2$ | $b_3$ |
|---|---|---|---|---|
| BIT LLR CALCULATION RESULT (PRESENT INVENTION IS NOT APPLIED) | 0.3717 | −0.4392 | −1.3034 | 0.0588 |
| CODE CONVERSION VALUE (SCRAMBLE CODE = 5) | 1 | −1 | 1 | −1 |
| CODE CONVERSION OUTPUT (EQUIVALENT TO DESCRAMBLING) | 0.3717 | 0.4392 | −1.3034 | −0.0588 |

FIG.10

|  | $b_0$ | $b_1$ | $b_2$ | $b_3$ |
|---|---|---|---|---|
| BIT LLR CALCULATION RESULT (PRESENT INVENTION IS APPLIED) | 0.3717 | 0.4392 | −1.3034 | −0.0588 |

WIRELESS COMMUNICATION DEVICE AND METHOD

CROSS-REFERENCE TO RELATED APPLICATION

This application is a Continuation-In-Part Application of PCT International Application No. PCT/JP2015/074958 filed on Sep. 2, 2015, which designated the United States. This application claims priority to Japanese Patent Application No. 2014-186030 filed on Sep. 2, 2014, the entire contents of which are incorporated herein by reference.

FIELD OF THE INVENTION

The present invention relates to a wireless communication device and method, and more particularly, to a wireless communication device and method for decoding data by calculating a soft symbol from a reception signal in which codes are interleaved and modulation symbol points are scrambled.

BACKGROUND OF THE INVENTION

For example, as specified in MIL-STD-188-110B of Non-patent Document 1, in baseband signal processing on the transmission side, a modulation bit sequence x(m) (m being a symbol number in a time direction) subjected to error correction encoding and interleaving is converted into a symbol mapping number N(m). Then, it is scrambled using a predetermined scramble code $N_{SCR}(m)$, and converted into a transmission symbol number $N_{TX}(m)$. Then, it is subjected to phase-shift keying (PSK) modulation or quadrature amplitude modulation (QAM) based on the mapping rule for data transmission.

In addition, in Appendix C of Non-Patent Document 1, QPSK (quadrature-PSK), 8PSK, 16QAM, 32QAM, and 64QAM are defined as modulation schemes to be used, and scrambling is defined as follows.

In PSK, scrambling is represented by the following equation:

$$N_{TX}(m) = \mathrm{mod}(N(m) + N_{SCR}(m), 8) \qquad \text{Eq. 1}$$

where mod(A, B) is a remainder obtained by dividing A by B. FIG. 1 shows the transmission symbol mapping number of PSK and its arrangement. It can be seen from FIG. 1 and Eq. 1 that PSK scrambling is phase rotation by $(\pi/4)*N_{SCR}(m)$.

In QAM, scrambling is represented by the following equation:

$$N_{TX}(m) = \mathrm{bitxor}(N(m), N_{SCR}(m)) \qquad \text{Eq. 2}$$

where bitxor(A, B) is an operation of converting A and B into binary numbers and performing XOR (exclusive OR) for each bit. As in the above equation, QAM scrambling is a process in which symbol mapping points are irregularly replaced, rather than simple phase rotation in PSK. Further, as shown in FIG. 2, the QAM symbol mapping points of MIL-STD-188-110B Appendix C are arranged in a shape (12/4 star QAM) which is not a general lattice shape.

When performing hard decision in equalization decision processing, descrambling may be performed on the hard-decided received bit sequence by performing a reverse operation of the scrambling of each modulation scheme.

In Patent Document 1, there has been proposed a method in which a transmission side baseband signal processing unit performs phase rotation on the symbol-mapped signal by $(\pi/4)*N_{SCR}(M)$, and a reception side baseband signal processing unit performs phase rotation on the received detection signal by $-(\pi/4)*N_{SCR}(m)$ to perform a process corresponding to descrambling, or performs phase rotation on the mapped reference point signal by $(\pi/4)*N_{SCR}(m)$, or all the combinations of symbol mapping points that can be obtained using the reference point signal symbol mapping number N(m) and the scramble code $N_{SCR}(m)$ can be stored in advance in a read-only memory (ROM) or the like and referred to.

Further, as the QAM descrambling method, there is a method that is faithful to the principle of calculating a bit likelihood and then performing code conversion (equivalent to XOR operation) with reference to the scramble code.

Patent Document 1: Japanese Patent Application Publication No. 2013-42444

Non-patent Document 1: United States Department of Defense, "Department of Defense, Interface Standard MIL-STD-188 110B Interoperability and Performance Standards for Data Modems", [online], 2000, [searched on Sep. 8, 2014], Internet<URL http://www.vocal.com/wp-content/uploads/2012/05/milstd_188110b.pdf>

However, in a demodulation process for QAM as in Non-patent Document 1, descrambling cannot be realized by simply manipulating an amplitude and/or a phase. Also, when dealing with a soft decision value and/or likelihood, it is necessary to calculate the likelihood in the case where all the symbol points are descrambled. In order to be able to process the QAM of Non-patent Document 1 in a wireless receiver of Patent Document 1, a correspondence table of all the combinations that can be obtained from all reference points and all scramble patterns is stored in the ROM and referred to, which also increases the amount of memory used, and is not preferable for implementation.

Further, in the case of using a conventional technique, in the bit likelihood calculation, two processes of phase rotation of PSK and bit code conversion of QAM are required, and the functions of implementation of the two processes and process selection are necessary.

Also, the same problem arises in the generation of the reference point which is necessary in a calculation process of a soft symbol calculation process in turbo equalization.

SUMMARY OF THE INVENTION

In view of the above, the present invention provides a technique for obtaining a reference point using a transmission symbol number obtained by scrambling a symbol number when generating the reference point, thereby realizing demodulation and soft symbol calculation for both PSK and QAM with simple implementation.

In accordance with an aspect of the present invention, there is provided a wireless communication device including: a transmission side baseband signal processing unit which includes:

- a means for converting a modulation bit sequence into a symbol mapping number;
- a means for generating a scramble code for the symbol mapping number;
- a symbol mapping number converting means for scrambling the symbol mapping number using the scramble code to convert the symbol mapping number into a transmission symbol mapping number;
- a means for performing mapping according to the transmission symbol mapping number and a corresponding modulation scheme; and a modulation transmission means for converting an output of the mapping into a time signal and converting and transmitting the time signal into a transmission frequency, and a reception side baseband signal processing unit which includes:

a means for receiving and detecting a signal transmitted by the modulation transmission means, a channel equalization means for performing channel equalization or its equivalent process on the detected signal;

a means for generating a first reference point symbol mapping number for generating a reference point in the modulation scheme;

a means for scrambling the first reference point symbol mapping number using the scramble code to convert the first reference point symbol mapping number into a first reference point transmission symbol mapping number;

a first reference point mapping means for performing mapping according to the first reference point transmission symbol mapping number and the modulation scheme;

a means for calculating a distance between an output of the first reference point mapping means and an output of the channel equalization means; and a means for calculating a bit likelihood by referring to the first reference point symbol mapping number and the distance.

In the wireless communication device, the transmission side baseband signal processing unit may further include a means for performing error correction encoding and a first interleaving means for performing interleaving on an error correction encoded signal and outputting an interleaved signal to the symbol mapping number converting means, and the reception side baseband signal processing unit may further include a means for deinterleaving the bit likelihood, a means for performing soft-input soft-output error correction decoding on the deinterleaved signal, a second interleaving means for applying the same interleaving pattern as the first interleaving means to the soft-input soft-output error correction decoded output, a means for converting a bit likelihood output from the second interleaving means into a bit probability, a symbol mapping probability calculating means for calculating a symbol mapping probability from the bit probability based on the modulation scheme, a means for generating a second reference point symbol mapping number for soft symbol calculation, a means for generating a second reference point transmission symbol mapping number using the scramble code for the second reference point symbol mapping number, a second reference point mapping means for performing mapping according to the second reference point transmission symbol mapping number and the modulation scheme, a soft symbol calculating means for calculating a soft symbol from an output of the symbol mapping probability calculating means and an output of the second reference point mapping means, and a turbo equalization means for feeding back an output of the soft symbol calculating means to the channel equalization means.

In accordance with another aspect of the present invention, there is provided a wireless communication method including:

on a transmission side, converting a modulation bit sequence into a predetermined symbol mapping number;

generating a scramble code for the symbol mapping number;

scrambling the symbol mapping number using the scramble code to convert the symbol mapping number into a transmission symbol mapping number;

performing mapping according to the transmission symbol mapping number and a corresponding modulation scheme; and converting an output of the mapping into a time signal and converting and transmitting the time signal into a transmission frequency, and further including:

on a reception side, receiving and detecting the transmitted signal;

performing channel equalization or its equivalent process on the detected signal;

generating a first reference point symbol mapping number for generating a reference point in the modulation scheme;

scrambling the first reference point symbol mapping number using the scramble code to convert the first reference point symbol mapping number into a first reference point transmission symbol mapping number;

performing mapping according to the first reference point transmission symbol mapping number and the modulation scheme;

calculating a distance between an output of the mapping and an output of the channel equalization; and calculating a bit likelihood by referring to the first reference point symbol mapping number and the distance.

According to the present invention, it is possible to generate a reference point for any symbol mapping pattern of PSK and QAM modulation schemes, and it is possible to realize a reduction in the amount of calculation and the amount of memory by a simple method in demodulation and soft symbol calculation. Also, the same bit likelihood calculation is applied for both PSK and QAM, so that a reduction in implementation scale can be achieved.

BRIEF DESCRIPTION OF THE DRAWINGS

FIG. 4 is a diagram showing an example of symbol mapping number conversion.

FIG. 8 shows a result of calculating a distance between the reception point and each reference point in FIG. 6.

FIG. 9 shows a bit LLR calculation result when the present invention is not applied.

FIG. 10 shows a bit LLR calculation result when the present invention is applied.

DETAILED DESCRIPTION OF THE EMBODIMENTS

Hereinafter, embodiments of the present invention will be described in detail with reference to the accompanying drawings.

First Embodiment

Figure 1:
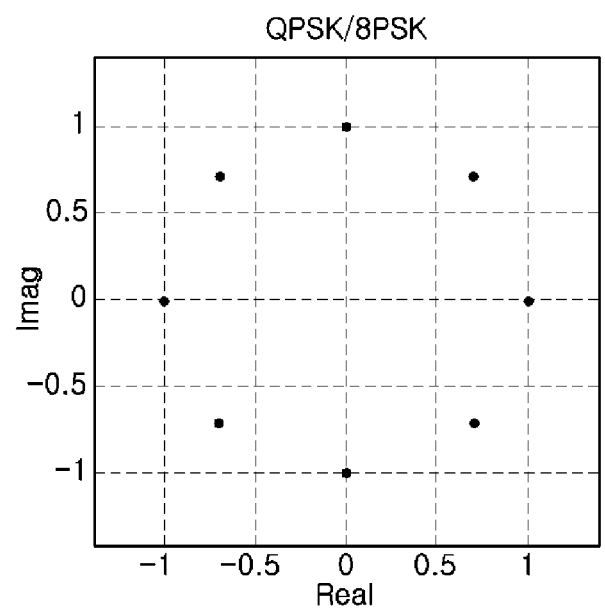
FIG. 1 is a diagram showing a symbol mapping point arrangement and a transmission symbol mapping number of PSK in MIL-STD-188-110B Appendix C.
Figure 2:
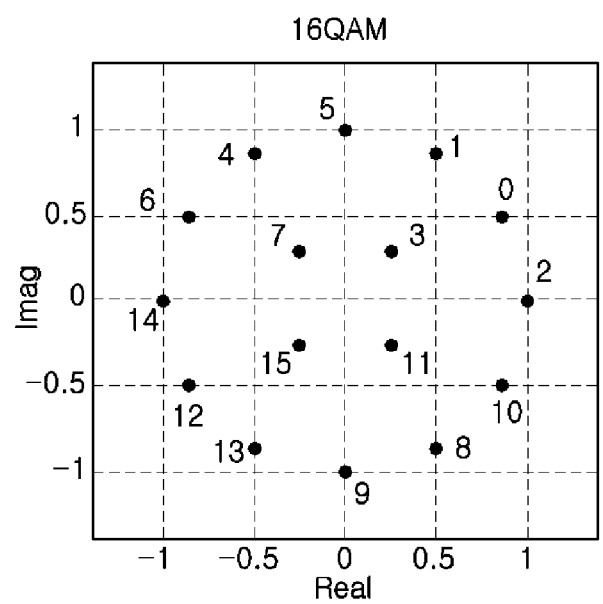
FIG. 2 is a diagram showing a symbol mapping point arrangement of QAM in MIL-STD-188-110B Appendix C.
Figure 3:
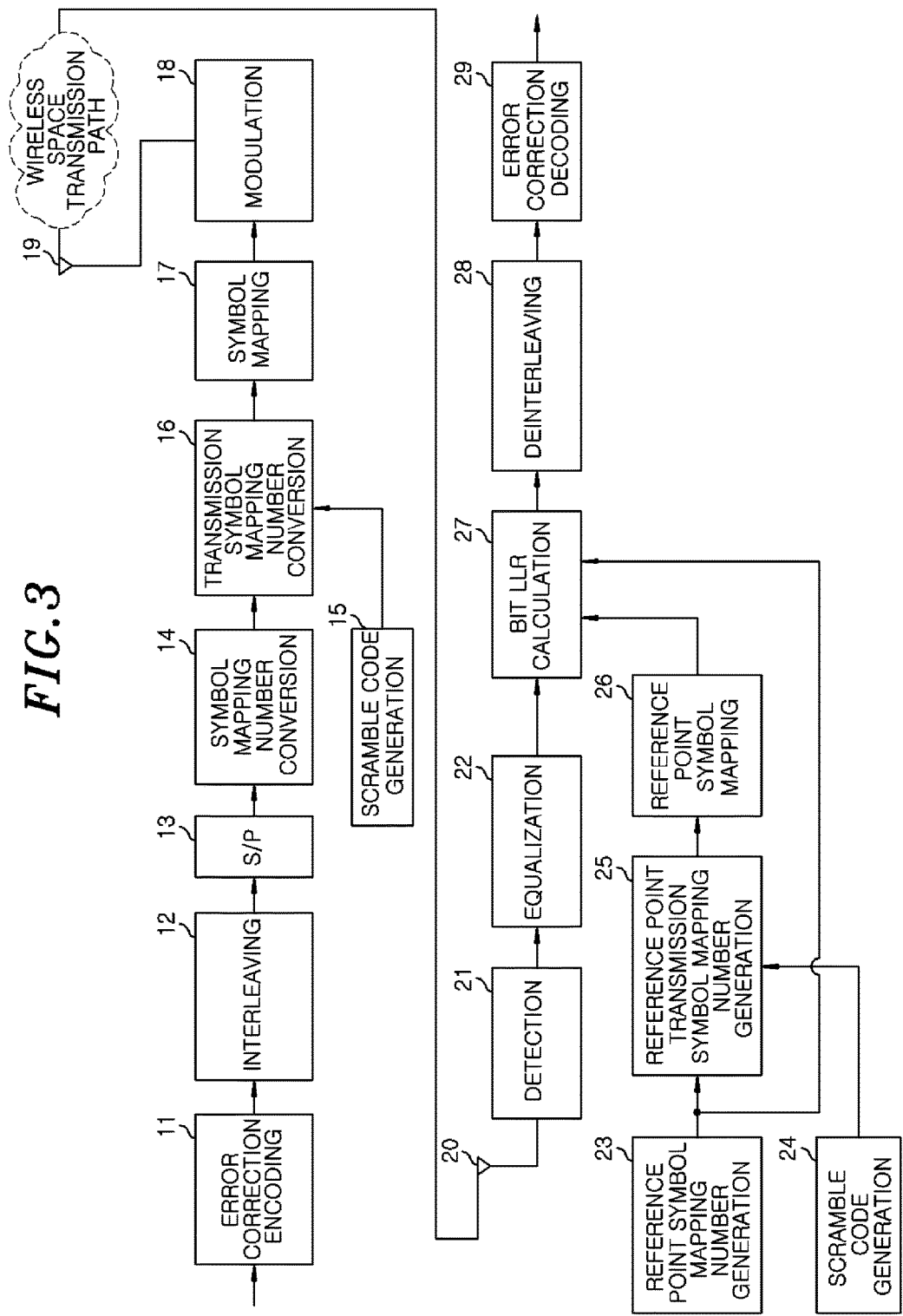
FIG. 3 is a functional block diagram showing a first embodiment of the present invention.

FIG. 3 shows a configuration of a wireless communication device 1 according to a first embodiment. The wireless communication device 1 includes an error correction encoder 11, an interleaver 12, a serial/parallel converter 13, a symbol mapping number converter 14, a scramble code generator 15, a transmission symbol mapping number converter 16, a symbol mapping unit 17, a modulator 18, a transmission antenna 19, a reception antenna 20, a detector 21, a channel equalizer 22, a reference point symbol mapping number generator 23, a scramble code generator 24, a reference point transmission symbol mapping number generator 25, a reference point symbol mapping unit 26, a bit LLR calculator 27, a deinterleaver 28, and an error correction decoder 29.

The error correction encoder 11 performs error correction encoding such as convolutional encoding on an input information bit sequence, and outputs it to the interleaver 12.

The interleaver 12 arranges the input bit sequence in a predetermined order, and outputs it to the serial/parallel converter 13.

The serial/parallel converter 13 bundles bits of the input bit sequence corresponding to each modulation bit number of a predetermined modulation scheme, and outputs it to the transmission symbol mapping number converter. For example, every 2 bits are processed in QPSK, and every 3 bits are processed in 8PSK.

The symbol mapping number converter 14 converts the input modulation bit sequence into a symbol mapping point number according to a predetermined conversion rule, and outputs it to the transmission symbol mapping number converter 16. As the conversion rule of the symbol mapping point, for example, in MIL-STD-188-110B Appendix C, conversion as shown in FIG. 4 is performed.

The scramble code generator 15 outputs the scramble code bit sequence of the number of bits according to the predetermined modulation scheme to the transmission symbol mapping number converter 16. The scramble code bit sequence uses, for example, an output according to a predetermined cut-out rule of a Pseudo-random Noise (PN) generator.

The transmission symbol mapping number converter 16, for example, as described in the Background of the Invention, when the symbol mapping number is N(m) and the scramble code is $N_{SCR}(m)$, calculates a transmission symbol mapping number $N_{TX}(m)$ using Eq. 1 or Eq. 2, and outputs the transmission symbol mapping number $N_{TX}(m)$ to the symbol mapping unit 17.

The symbol mapping unit 17 selects a predetermined symbol mapping point using the input transmission symbol mapping number $N_{TX}(m)$, and outputs the selected symbol mapping point to the modulator 18.

The modulator 18 converts the input mapping output into a time signal, converts the time signal into a transmission frequency, and outputs it to the transmission antenna 19.

The transmission antenna 19 transmits the input modulation signal to a wireless transmission space.

The reception antenna 20 receives the transmission signal from the wireless transmission space and outputs it to the detector 21.

The detector 21 detects the input signal, converts it into a frequency signal, and outputs it to the channel equalizer 22.

The channel equalizer 22 estimates a channel distortion between transmission and reception of the input reception frequency signal, corrects it, and outputs it to the bit LLR calculator 27. For channel equalization, when the reception signal is Y(m), the estimated channel between transmission and reception is Ĥ(m), and an equalization output is X̂(m), channel equalization is performed by using, for example, Eq. 3 or Eq. 4 according to the minimum mean square error (MMSE) criterion.

$$\hat{X}(m) = \frac{Y(m)}{\hat{H}(m)} \qquad \text{Eq. 3}$$

$$\hat{X}(m) = \frac{Y(m)}{\left(\hat{H}(m)\hat{H}^{H}(m) + \sigma^2\right)^{-1}\hat{H}(m)} \qquad \text{Eq. 4}$$

where $[\bullet]^H$ is a complex conjugate and $\sigma^2$ is a noise power.

The reference point symbol mapping number generator 23 generates an integer (reference point symbol mapping number) of 0 ... Q–1, where Q represents the number of mapping points that can be obtained by the modulation scheme, and outputs it to the reference point transmission symbol mapping number generator 25 and the bit LLR calculator 27. For example, a register value prepared in advance, a read value of a ROM, and a counter value are used for number generation.

The scramble code generator 24 has the same function as the scramble code generator 15, and outputs the generated scramble code bit sequence to the reference point transmission symbol mapping number generator 25.

The reference point transmission symbol mapping number generator 25 has the same function as the transmission symbol mapping number converter 16, generates a reference point transmission symbol mapping number from the input reference point symbol mapping number and the scramble code bit sequence, and outputs it to the reference point symbol mapping unit 26.

The reference point symbol mapping unit 26 has the same function as the symbol mapping unit 17, selects a predetermined mapping point using the input reference point transmission symbol mapping number, and outputs it to the bit LLR calculator 27.

The bit LLR calculator 27 calculates a bit likelihood using the input channel equalization output, the reference point mapping output and the reference point symbol mapping number, and outputs the bit likelihood to the deinterleaver 28. Hereinafter, the bit likelihood calculation in addition to the transmission-side processing and the reference point generation will be described.

Figure 5:
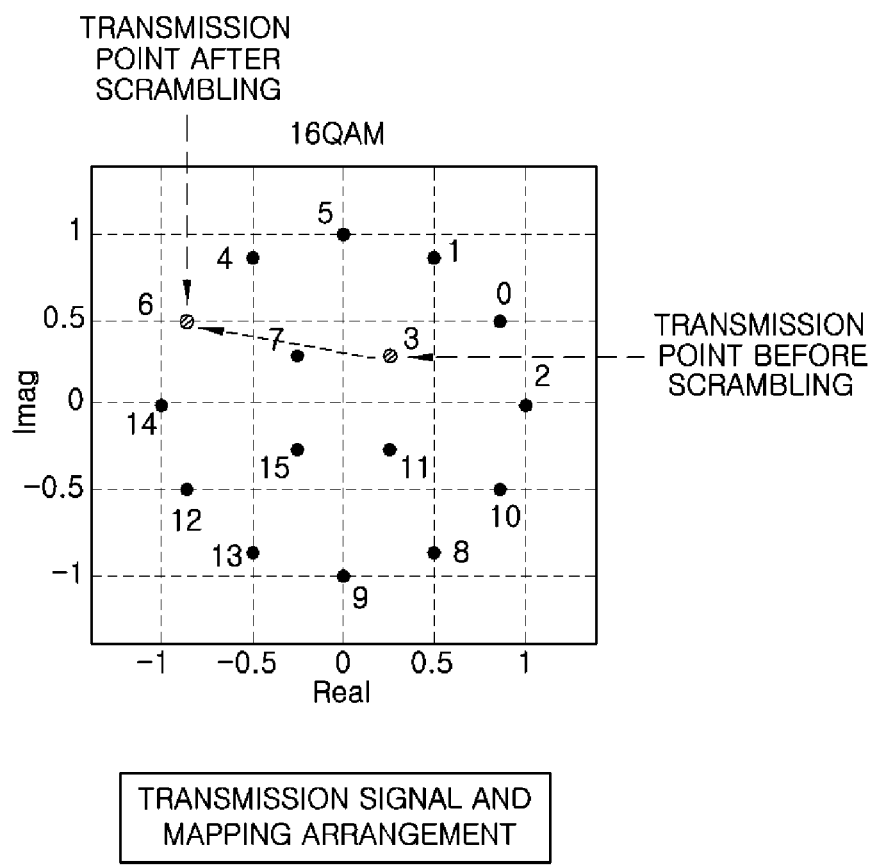
FIG. 5 is a diagram for explaining an example of an operation according to a transmission signal and scrambling.

FIG. 5 shows an example of a transmission signal of 16QAM, which is an example when the symbol mapping number is 3 and the scramble code is 5. The transmission symbol mapping number is converted into 6 by using Eq. 2. Therefore, with this symbol, the symbol mapping number 6 is mapped and outputted.

Figure 6A:
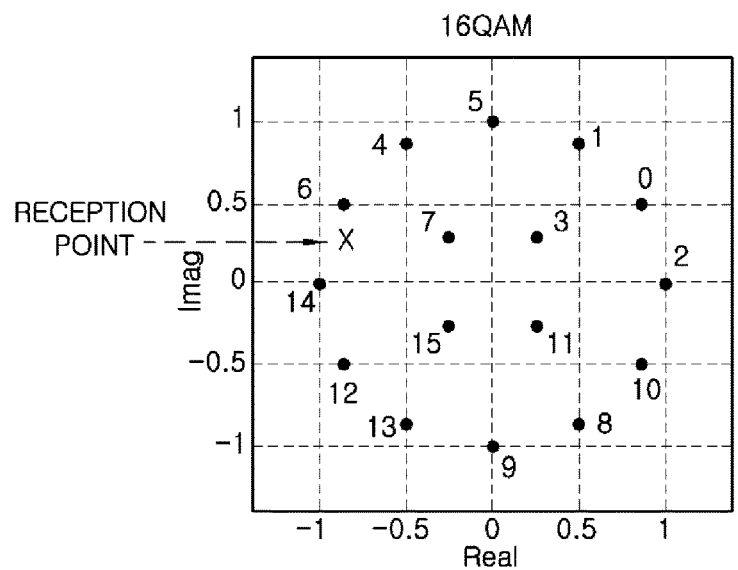
FIGS. 6A and 6B are diagrams for explaining an example of a reference point according to a reception signal and scrambling.
Figure 6B:
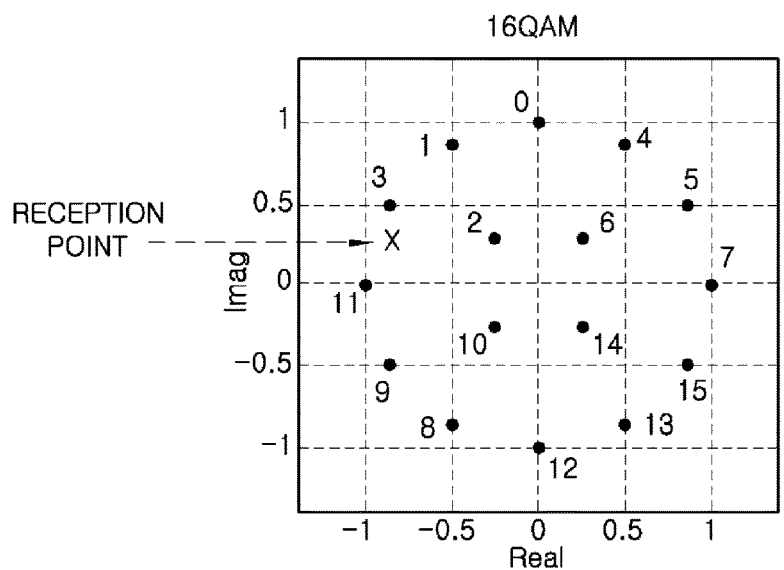

FIGS. 6A and 6B respectively show states before and after scrambling of the transmission symbol number is applied to a reception point and reference points when the transmission signal of FIG. 5 is received.

First, hard decision of the reception signal will be considered. In the case where the present invention is not applied, an arrangement of mapping points of reference points is shown in FIG. 6A, and it is apparent that a point having a minimum distance is 6. Therefore, when hard decision is made, the transmission symbol mapping number of a transmission source of the reception signal is 6. When 6 is descrambled, 3 is obtained, which coincides with the symbol mapping number of the transmission source.

In the case where the present invention is applied, an arrangement of mapping points of reference points is shown in FIG. 6B, and it is apparent that a point having a minimum distance is 3. Therefore, when hard decision is made, it is obtained that the symbol mapping number of the transmission source of the reception signal is 3.

Next, calculation of a soft decision bit likelihood will be considered. As mentioned above, since the mapping arrangement of MIL-STD-188-110B Appendix C does not have a lattice shape, a value of a real part or an imaginary part of the equalization output cannot be used as a likelihood, and thus, a distance from the reference point is measured to calculate the likelihood. Here, a bit log likelihood ratio (LLR) is considered. The bit LLR $\lambda(m, b_n)$ is calculated, for example, by the following equation:

$$\lambda(m, b_n) = \log \frac{\sum_{q=0}^{Q-1} Y_R(m, q) \in (b_n = 0) \exp\left(-\frac{|Y_R(m, q) - Y(m)|^2}{\sigma^2}\right)}{\sum_{q=0}^{Q-1} Y_R(m, q) \in (b_n = 1) \exp\left(-\frac{|Y_R(m, q) - Y(m)|^2}{\sigma^2}\right)} \quad \text{Eq. 5}$$

where $b_n$ is the n-th bit of the modulation bit of the symbol, q is the reference point symbol mapping number, and $Y_R(m, q)$ is the reference point symbol mapping output. Here, by using the approximate expression:

$$\log \sum_i \exp(x_i) \cong \max(x_i), \quad \text{Eq. 6}$$

Eq. 5 can be approximated to the following equation:

$$\lambda(m, b_n) = \frac{\min_{Y_R(m,q) \in (b_n=1)} |Y_R(m, q) - Y(m)|^2 - \min_{Y_R(m,q) \in (b_n=0)} |Y_R(m, q) - Y(m)|^2}{\sigma^2} \quad \text{Eq. 7}$$

Therefore, it is calculated by using the minimum distance to 1 and the minimum distance to 0 with respect to each bit. The above method can be applied even if the mapping arrangement has a lattice shape. Further, a known method for finding the symbol having the minimum distance more efficiently than the full search can be utilized.

The bit likelihood calculation process in the present embodiment is a method of calculating the likelihood by obtaining a distance from the reference point with respect to the equalization output of the mapping arrangement which does not have a lattice shape, and is different from maximum likelihood detection (MLD) which generates a replica using the channel estimation value and the reference mapping point and calculates a distance between the reception signal and the replica.

Figure 7:
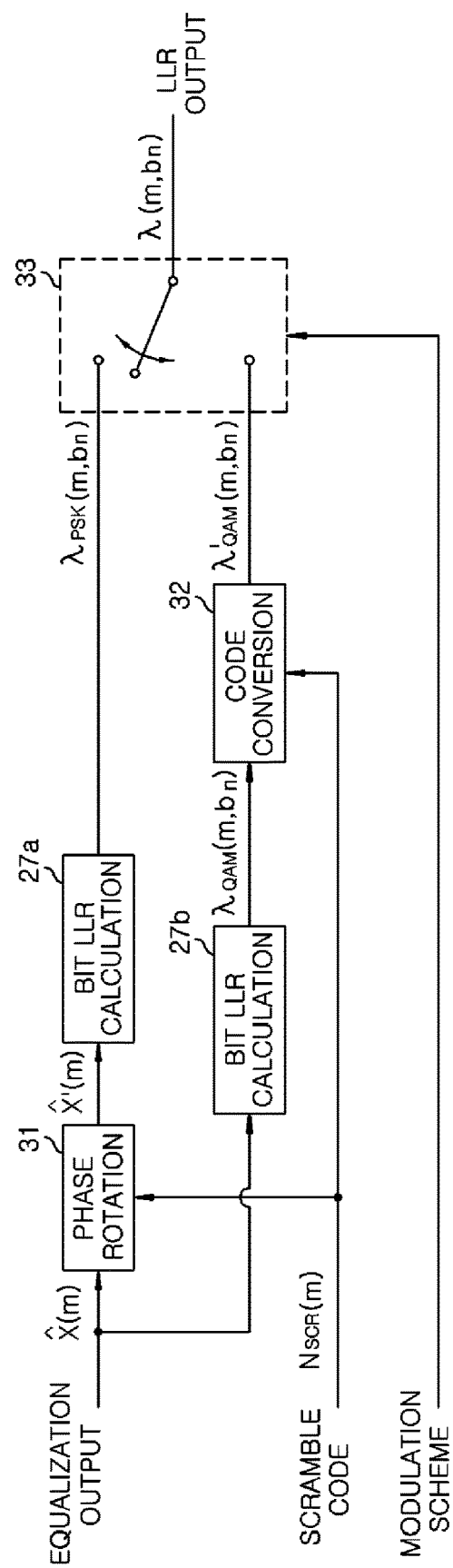
FIG. 7 shows a functional block diagram of bit LLR calculation when the present invention is not applied.

For comparison, FIG. 7 shows a configuration of an LLR calculation unit 30 in the case where the bit likelihood calculation process of the present embodiment is not applied. The LLR calculation unit 30 includes a phase rotation unit 31, bit LLR calculators 27a and 27b, a code converter 32, and a signal selector 33. Since the bit LLR calculators 27a and 27b are similar to the bit LLR calculator 27 described above, a redundant description will be omitted.

The phase rotation unit 31 outputs a signal $\hat{X}'(m)$ obtained by performing phase rotation on the equalization output signal $\hat{X}(m)$ using the scramble code $N_{SCR}(m)$ to the bit LLR calculator 27. The phase rotation is calculated, for example, by the following equation:

$$\hat{X}'(m) = \hat{X}(m) \cdot \exp\left(-j \frac{\pi}{4} N_{SCR}(m)\right) \quad \text{Eq. 8}$$

where j is an imaginary unit. This operation corresponds to descrambling in PSK.

On the other hand, in the case of QAM, the bit LLR calculator 27b calculates a bit LLR $\lambda_{QAM}(m, b_n)$ from the input equalization output signal $\hat{X}(m)$, for example, based on Eq. 7.

FIG. 8 shows a distance calculation result in a bit LLR calculation process when the reception point in 16QAM of FIG. 6 is set to (−0.9, 0.3). In obtaining the LLR of each bit, a symbol whose bit is 0 and which has the minimum distance and a symbol whose bit is 1 and which has the minimum distance (in this example, symbol mapping numbers 6, 7, 14) are selected.

The code converter 32 performs code conversion according to the scramble code $N_{SCR}(m)$ on the bit LLR $\lambda_{QAM}(m, b_n)$ inputted from the bit LLR calculator 27b, and outputs the code-converted bit LLR $\lambda'_{QAM}(m, b_n)$ to the signal selector 33. The code conversion is performed, for example, according to the following equation:

$$\lambda_{QAM}'(m,b_n) = \lambda_{QAM}(m,b_n) \times \{1 - 2 \cdot \text{bitget}(N_{SCR}(m),n)\} \quad \text{Eq. 9}$$

where bitget(A, B) is a function that extracts the B-th bit when A is represented by a binary number. This operation corresponds to descrambling in QAM.

With regard to the input bit LLR $\lambda_{PSK}(m, b_n)$ and $\lambda'_{QAM}(m, b_n)$, the signal selector 33 selects and outputs $\lambda_{PSK}(m, b_n)$ if the modulation scheme is PSK, and selects and outputs $\lambda'_{QAM}(m, b_n)$ if the modulation scheme is QAM.

Here, FIG. 9 shows the LLR and code conversion output of each bit based on Eq. 7 if the reception point is (−0.9, 0.3) when the first embodiment is not applied. For simplicity of explanation, calculation was made with $\sigma^2=1$.

FIG. 10 shows a bit LLR calculation result according to the first embodiment (scrambling the reference point symbol mapping number). It can be seen from both results that the same calculation result is obtained. In the case of applying the first embodiment, it is unnecessary to classify the process into PSK and QAM cases and to select the output as shown in FIG. 7.

Referring back to FIG. 3, the deinterleaver 28 rearranges the input bit LLR arranged by the interleaver 12 in the original arrangement order, and outputs it to the error correction decoder 29.

The error correction decoder 29 performs error correction decoding such as Viterbi algorithm decoding on the input bit LLR, and outputs an error correction result.

According to the first embodiment described above, by receiving the transmission signal in which the symbol mapping number is scrambled on the transmission side and generating the reference point by scrambling the reference point symbol mapping number, it is possible to calculate a soft decision value such as bit LLR.

Second Embodiment

Figure 11:
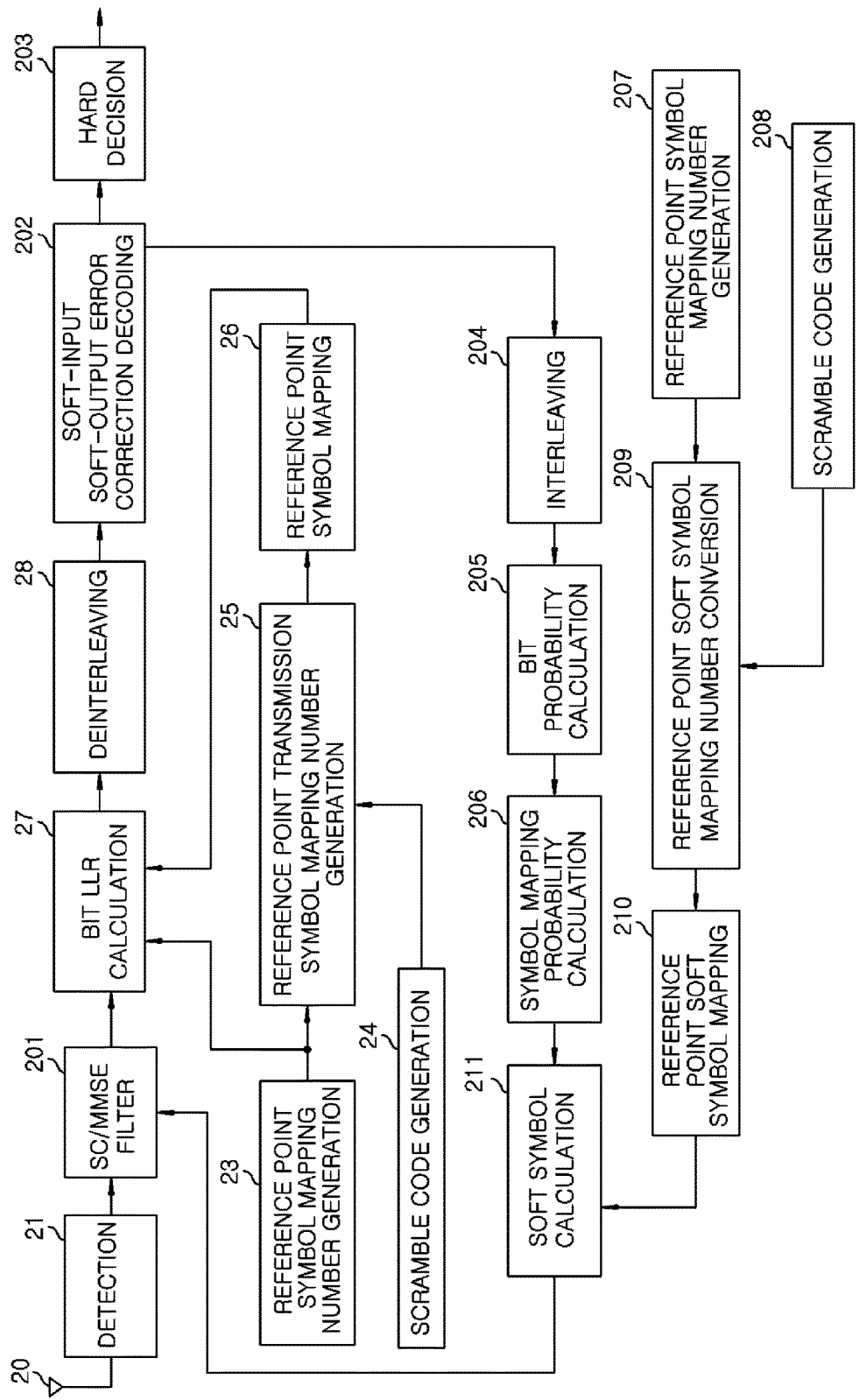
FIG. 11 is a functional block diagram showing a second embodiment of the present invention.

FIG. 11 shows a configuration of a wireless communication device according to a second embodiment of the present invention. A wireless communication device 200 according to the second embodiment comprises a wireless transmitter which includes an error correction encoder 11, an interleaver 12, a serial/parallel converter 13, a symbol mapping number converter 14, a scramble code generator 15, a transmission symbol mapping number converter 16, a symbol mapping unit 17, a modulator 18, and a transmission antenna 19, and a wireless receiver which includes a reception antenna 20, a detector 21, a SC/MMSE filter 201, a reference point symbol mapping number generator 23, a scramble code generator 24, a reference point transmission symbol mapping number generator 25, a reference point symbol mapping unit 26, a bit LLR calculator 27, a deinterleaver 28, a soft-input soft-output error correction decoder 202, a hard decision unit 203, an interleaver 204, a bit probability calculator 205, a symbol mapping probability calculator 206, a reference point symbol mapping number generator 207, a scramble code generator 208, a reference point soft symbol mapping number converter 209, a reference point soft symbol mapping unit 210, and a soft symbol calculator 211. The wireless receiver realizes iterative decoding using a soft symbol (soft decision value).

All the configurations (the error correction encoder to the transmission antenna 19) of the wireless transmitter are the same as those in the first embodiment and are not illustrated.

Also, among the configurations of the wireless receiver, since the reception antenna 20, the detector 21, the reference point symbol mapping number generator 23, the scramble code generator 24, the reference point transmission symbol mapping number generator 25, the reference point symbol mapping unit 26, the bit LLR calculator 27, and the deinterleaver 28 are the same as those in the first embodiment, a description thereof will be omitted.

The SC/MMSE filter 201 estimates a channel between transmission and reception from the input reception signal, generates a reference point of an interference component included in the reception signal from the channel estimation result and the input soft symbol, subtracts it from the reception signal, performs equalization based on the MMSE criterion, and outputs an equalization output to the bit LLR calculator 27.

The soft-input soft-output error correction decoder 202 performs soft-input soft-output error correction decoding on the input bit LLR based on, for example, a soft output Viterbi algorithm (SOVA) or Bahl-Cocke-Jelinek-Raviv (BCJR) algorithm, and outputs the decoding result to the hard decision unit 203 and the interleaver 204.

For example, the hard decision unit 203 performs hard decision to output 0 if a sign of the input bit LLR is positive and to output 1 if it is negative, and outputs the decision result.

The interleaver 204 arranges the input bit LLR in the same order as the interleaver 12, and outputs it to the bit probability calculator 205.

The bit probability calculator 205 calculates a bit probability from the input bit LLR and outputs the bit probability to the symbol mapping probability calculator 206. The calculation of the bit probability is performed, for example, when $L_e^D(m, b_n)$ refers to the error-corrected bit LLR, $p_0(m, b_n)$ refers to the bit probability that the bit is 0, and $p_1(m, b_n)$ refers to the bit probability that the bit is 1, by the following equations:

$$p_0(m, b_n) = \frac{1}{1 + e^{-L_e^D(m,b_n)}} \quad \text{Eq. 10}$$

$$p_1(m, b_n) = \frac{1}{1 + e^{L_e^D(m,b_n)}} \quad \text{Eq. 11}$$

The symbol mapping probability calculator 206 calculates a symbol mapping probability $P_q(m)$ using the input bit probabilities $p_0(m, b_n)$ and $p_1(m, b_n)$, and outputs it to the soft symbol calculator 211. The calculation of the symbol mapping probability is performed, for example, by the following equation:

$$P_q(m) = \prod_{n=0}^{R-1} p_u(m, b_n) \quad \text{Eq. 12}$$

where B is the modulation bit number of the modulation scheme. Also, u is calculated by the following equation:

$$u = \text{bitget}(i,n) \quad \text{Eq. 13}$$

The reference point symbol mapping number generator 207 has the same function as the reference point symbol mapping number generator 23, generates an integer (reference point symbol mapping number) of 0 ... Q−1, where Q represents the number of mapping points that can be obtained by the modulation scheme, and outputs it to the reference point soft symbol mapping number converter 209. For example, a register value prepared in advance, a read value of a ROM, and a counter value are used for number generation.

The scramble code generator 208 has the same function as the scramble code generator 15 and the scramble code generator 24, and outputs the generated scramble code bit sequence to the reference point soft symbol mapping number converter 209.

The reference point soft symbol mapping number converter 209 has the same function as the transmission symbol mapping number converter 16 and the reference point transmission symbol mapping number generator 25, generates a reference point transmission symbol mapping number from the input reference point symbol mapping number and the scramble code bit sequence, and outputs it to the reference point soft symbol mapping unit 210.

The reference point soft symbol mapping unit 210 has the same function as the symbol mapping unit 17 and the reference point symbol mapping unit 26, selects a predetermined mapping point using the input reference point transmission soft symbol mapping number, and outputs it to the soft symbol calculator 211.

The soft symbol calculator 211 calculates a soft symbol using the input symbol mapping probability $P_q(m)$ and the reference point symbol mapping output $S_q(m)$, and outputs the calculation result to the SC/MMSE filter 201. The calculation of the soft symbol S(m) is performed, for example, by the following equation:

$$\tilde{S}(m) = \sum_{q=0}^{Q-1} S_{q'}(m) \cdot P_q(m) \quad \text{Eq. 14}$$

where q' is obtained by Eq. 15 when the modulation scheme is PSK, and obtained by Eq. 16 when the modulation scheme is QAM.

$$q'=\mathrm{mod}(q+N_{SCR},8) \qquad \text{Eq. 15}$$

$$q'=\mathrm{bitxor}(q,N_{SCR}) \qquad \text{Eq. 16}$$

Figure 12:
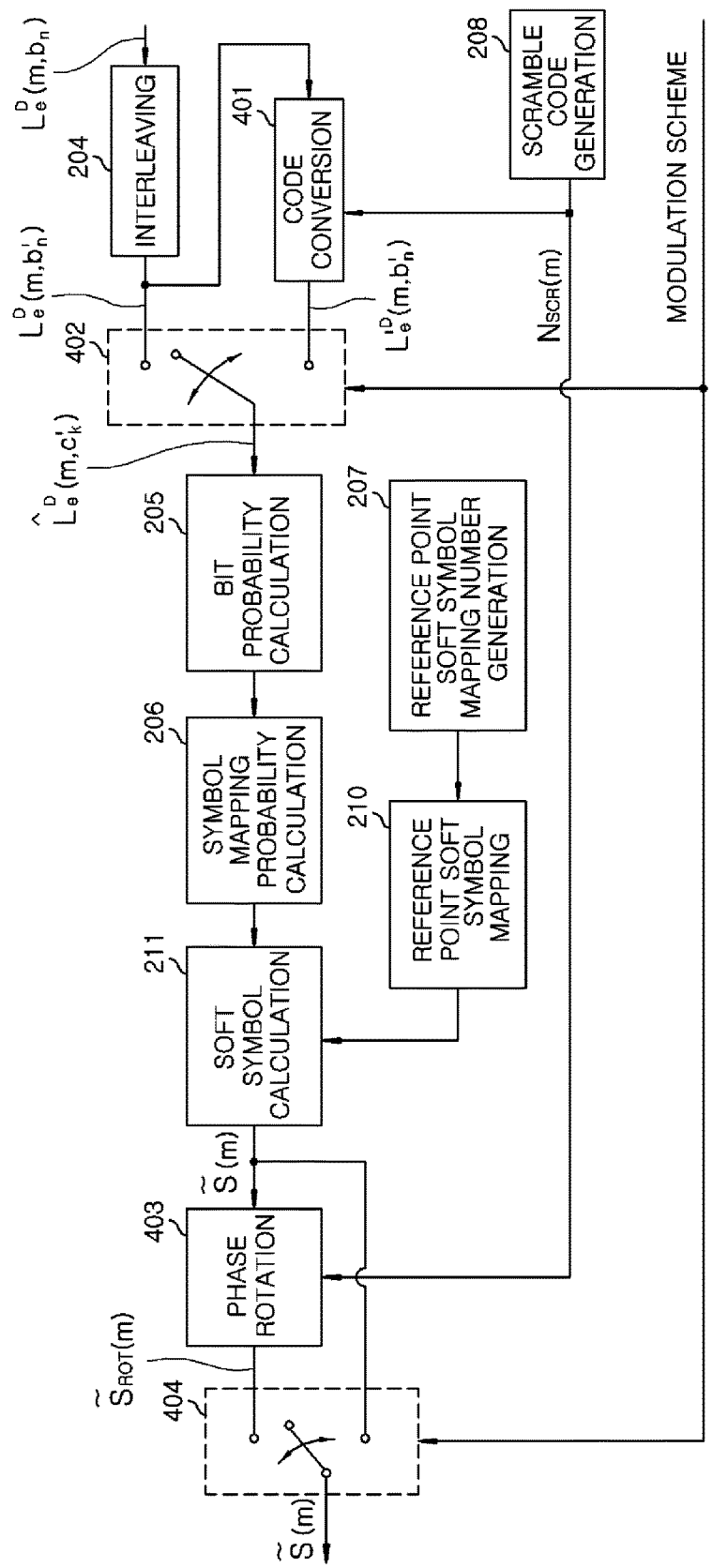
FIG. 12 is a functional block diagram of soft symbol calculation when the present invention is not applied.

FIG. 12 shows a configuration of soft symbol calculation when the second embodiment is not applied. The soft symbol calculation configuration of FIG. 12 includes the interleaver 204, a code converter 401, a signal selector 402, the bit probability calculator 205, the symbol mapping probability calculator 206, the reference point symbol mapping number generator 207, the scramble code generator 208, the reference point soft symbol mapping unit 210, the soft symbol calculator 211, a phase rotation unit 403, and a signal selector 404.

The interleaver 204, the bit probability calculator 205, the symbol mapping probability calculator 206, the reference point symbol mapping number generator 207, the scramble code generator 208, the reference point soft symbol mapping unit 210, and the soft symbol calculator 211 are the same as those in the second embodiment, and thus a description thereof will be omitted.

The code converter 401 has the same function as the code converter 32, performs code conversion according to the input scramble code $N_{SCR}(m)$ on the input bit LLR $L_e^D(m, b'_n)$, and outputs the code-converted bit LLR $L_e^{\prime D}(m, b'_n)$ to the signal selector 402.

Upon receiving the input bit LLR $L_e^D(m, b'_n)$ and the code-converted bit LLR $L_e^{\prime D}(m, b'_n)$, depending on the modulation scheme, the signal selector 402 selects $L_e^D(m, b'_n)$ if the modulation scheme is PSK and selects $L_e^{\prime D}(m, b'_n)$ if the modulation scheme is QAM, and outputs it to the bit probability calculator 205.

The phase rotation unit 403 has the same function as the phase rotation unit 31, performs phase rotation according to the scramble code $N_{SCR}(m)$ on the input soft symbol $\tilde{S}'(m)$, and outputs the phase-rotated soft symbol $\tilde{S}_{ROT}'(m)$ to the signal selector 404.

Upon receiving the input soft symbol $\tilde{S}'(m)$ and the phase-rotated soft symbol $\tilde{S}_{ROT}'(m)$, depending on the modulation scheme, the signal selector 404 selects $\tilde{S}_{ROT}'(m)$ if the modulation scheme is PSK and selects $\tilde{S}'(m)$ if the modulation scheme is QAM, and outputs it.

As described above, when the second embodiment is not applied, two processes of code conversion and phase rotation are required.

According to the second embodiment described above, by receiving the transmission signal in which the symbol mapping number is scrambled on the transmission side and, when computing a soft symbol used for turbo equalization, generating a reference point signal by scrambling the reference point symbol mapping number, it is possible to calculate a soft symbol. Further, in the case where the second embodiment is not applied, code conversion and phase rotation are required, but the present invention does not require them and can realize a reduction in implementation scale.

Further, the present invention is particularly suitable for a wireless communication system defined by MIL-STD-188-110B, but is not limited thereto.

The scope and spirit of the present invention are not limited to the exemplary embodiments which are illustrated and described, but also include all embodiments which have effects similar to those of the present invention. Further, the scope and spirit of the present invention may be defined by any desired combination of specific features among all disclosed features.

INDUSTRIAL APPLICABILITY

The present invention can be applied to various types of wireless communication systems that perform wireless communication using white space.

DESCRIPTION OF REFERENCE NUMERALS

11: error correction encoder
12: interleaver
13: serial/parallel converter
14: symbol mapping number converter
15: scramble code generator
16: transmission symbol mapping number converter
17: symbol mapping unit
18: modulator
19: transmission antenna
20: reception antenna
21: detector
22: channel equalizer
23: reference point symbol mapping number generator
24: scramble code generator
25: reference point transmission symbol mapping number generator
26: reference point symbol mapping unit
27: bit LLR calculator
28: deinterleaver
29: error correction decoder
201: SC/MMSE filter
202: soft-input soft-output error correction decoder
203: hard decision unit
204: interleaver
205: bit probability calculator
206: symbol mapping probability calculator
207: reference point symbol mapping number generator
208: scramble code generator
209: reference point soft symbol mapping number converter
210: reference point soft symbol mapping unit
211: soft symbol calculator
31: phase rotation unit
32: code converter
33: signal selector
401: code converter
402: signal selector
403: phase rotation unit
404: signal selector

What is claimed is:
1. A wireless communication device comprising:
a transmission side baseband signal processing unit which includes:
a means for converting a modulation bit sequence into a symbol mapping number;
a means for generating a scramble code for the symbol mapping number;
a symbol mapping number converting means for scrambling the symbol mapping number using the scramble code to convert the symbol mapping number into a transmission symbol mapping number;
a means for performing mapping according to the transmission symbol mapping number and a corresponding modulation scheme; and a modulation transmission means for converting an output of the mapping into a time signal and converting and transmitting the time signal into a transmission frequency, and a reception side baseband signal processing unit which includes:

a means for receiving and detecting a signal transmitted by the modulation transmission means, a channel equalization means for performing channel equalization or its equivalent process on the detected signal;

a means for generating a first reference point symbol mapping number for generating a reference point in the modulation scheme;

a means for scrambling the first reference point symbol mapping number using the scramble code to convert the first reference point symbol mapping number into a first reference point transmission symbol mapping number;

a first reference point mapping means for performing mapping according to the first reference point transmission symbol mapping number and the modulation scheme;

a means for calculating a distance between an output of the first reference point mapping means and an output of the channel equalization means; and a means for calculating a bit likelihood by referring to the first reference point symbol mapping number and the distance.

2. The wireless communication device of claim 1, wherein the transmission side baseband signal processing unit further includes a means for performing error correction encoding and a first interleaving means for performing interleaving on an error correction encoded signal and outputting an interleaved signal to the symbol mapping number converting means, and the reception side baseband signal processing unit further includes a means for deinterleaving the bit likelihood, a means for performing soft-input soft-output error correction decoding on the deinterleaved signal, a second interleaving means for applying the same interleaving pattern as the first interleaving means to the soft-input soft-output error correction decoded output, a means for converting a bit likelihood output from the second interleaving means into a bit probability, a symbol mapping probability calculating means for calculating a symbol mapping probability from the bit probability based on the modulation scheme, a means for generating a second reference point symbol mapping number for soft symbol calculation, a means for generating a second reference point transmission symbol mapping number using the scramble code for the second reference point symbol mapping number, a second reference point mapping means for performing mapping according to the second reference point transmission symbol mapping number and the modulation scheme, a soft symbol calculating means for calculating a soft symbol from an output of the symbol mapping probability calculating means and an output of the second reference point mapping means, and a turbo equalization means for feeding back an output of the soft symbol calculating means to the channel equalization means.

* * * * *